(12) United States Patent
Masui et al.

(10) Patent No.: US 8,278,678 B2
(45) Date of Patent: *Oct. 2, 2012

(54) LIGHT EMITTING DEVICE

(75) Inventors: Mikio Masui, Kashihara (JP); Youji Urano, Ikeda (JP)

(73) Assignee: Panasonic Corporation, Osaka (JP)

( * ) Notice: Subject to any disclaimer, the term of this patent is extended or adjusted under 35 U.S.C. 154(b) by 474 days.

This patent is subject to a terminal disclaimer.

(21) Appl. No.: 12/094,136

(22) PCT Filed: Dec. 28, 2005

(86) PCT No.: PCT/JP2005/024033
§ 371 (c)(1),
(2), (4) Date: May 16, 2008

(87) PCT Pub. No.: WO2007/057984
PCT Pub. Date: May 24, 2007

(65) Prior Publication Data
US 2009/0095967 A1 Apr. 16, 2009

(30) Foreign Application Priority Data
Nov. 21, 2005 (JP) .................. 2005-336192

(51) Int. Cl.
H01L 23/28 (2006.01)
H01L 23/373 (2006.01)

(52) U.S. Cl. ..... 257/99; 257/98; 257/100; 257/E33.058; 257/E33.059; 257/E33.061; 438/27

(58) Field of Classification Search ............ 257/98–100, 257/E33.058–E33.061, E21.499; 438/27
See application file for complete search history.

(56) References Cited

U.S. PATENT DOCUMENTS

| 6,204,523 | B1 | 3/2001 | Carey et al. |
| 6,274,890 | B1 | 8/2001 | Oshio et al. |
| 6,365,920 | B1 | 4/2002 | Abramov et al. |
| 6,498,355 | B1* | 12/2002 | Harrah et al. ............. 257/99 |
| 6,541,800 | B2* | 4/2003 | Barnett et al. ............. 257/98 |
| 2001/0010371 | A1 | 8/2001 | Carey et al. |
| 2001/0030866 | A1* | 10/2001 | Hochstein ............. 362/294 |

(Continued)

FOREIGN PATENT DOCUMENTS
DE 199 38 053 A1 5/2000
(Continued)

OTHER PUBLICATIONS

International Search Report for the Application No. PCT/JP2005/024033 mailed Mar. 14, 2006.

(Continued)

Primary Examiner — Allan R Wilson
(74) Attorney, Agent, or Firm — Cheng Law Group, PLLC

(57) ABSTRACT

The lighting device (1) includes an LED chip (10), a mounting substrate (20) mounting thereto the LED chip, an encapsulation member (50) made of an encapsulating resin material for encapsulation of the LED chip, and a lens (60) made of a transparent resin material. The lens (60) is provided in its bottom with a recess (40) and is secured to the mounting substrate (20) with the encapsulation member (50) disposed within the recess (40). The encapsulation member (50) is confined within the recess of the lens of the transparent resin material, which minimizes a difference in the coefficient of linear expansion between the encapsulation member and the surroundings for restraining occurrence of voids in the encapsulation member at a low temperature.

9 Claims, 12 Drawing Sheets

U.S. PATENT DOCUMENTS

| | | | |
|---|---|---|---|
| 2001/0042865 A1 | 11/2001 | Oshio et al. | |
| 2002/0134569 A1 | 9/2002 | Farquhar et al. | |
| 2004/0061124 A1* | 4/2004 | Trottier et al. | 257/103 |
| 2004/0169466 A1* | 9/2004 | Suehiro et al. | 313/512 |
| 2004/0256706 A1 | 12/2004 | Nakashima | |
| 2005/0218790 A1 | 10/2005 | Blumel | |
| 2005/0239227 A1* | 10/2005 | Aanegola et al. | 438/26 |
| 2006/0054915 A1* | 3/2006 | Chang | 257/100 |
| 2009/0267093 A1 | 10/2009 | Kamada et al. | |
| 2009/0295265 A1* | 12/2009 | Tabuchi et al. | 313/112 |
| 2010/0200887 A1* | 8/2010 | Urano et al. | 257/98 |
| 2010/0301373 A1* | 12/2010 | Urano et al. | 257/98 |

FOREIGN PATENT DOCUMENTS

| | | |
|---|---|---|
| EP | 0 976 589 A1 | 2/2000 |
| EP | 1 928 029 A1 | 6/2008 |
| JP | 51-120692 U | 9/1976 |
| JP | 10-261821 A | 9/1998 |
| JP | 2000-156526 A | 6/2000 |
| JP | 2000-269555 A | 9/2000 |
| JP | 2001-085748 A | 3/2001 |
| JP | 2001-148514 A | 5/2001 |
| JP | 2002-094122 A | 3/2002 |
| JP | 2004-207660 A | 7/2004 |
| JP | 2005-101393 A | 4/2005 |
| JP | 2005-109282 A | 4/2005 |
| JP | 2005-123477 A | 5/2005 |
| JP | 2005-136224 A | 5/2005 |
| JP | 2005-159045 A | 6/2005 |
| JP | 2005-197728 A | 7/2005 |

OTHER PUBLICATIONS

Notification of Reasons for Refusal for the Application No. 2005-336192 from Japan Patent Office, mailed May 15, 2007.

Supplementary European Search Report for the Application No. EP 05 84 4850 dated Dec. 22, 2009.

European Search Report for the Application No. EP 10 17 3315 dated Jul. 5, 2011.

Partial European Search Report for the Application No. EP 10 17 3315 dated Feb. 17, 2011.

* cited by examiner though the
LIGHT EMITTING DEVICE

TECHNICAL FIELD

The invention relates to a light emitting device using an LED (Light Emitting Diode) chip and a fabrication method thereof.

BACKGROUND ART

Japanese Unexamined Patent Application Publication No. 2001-85748 (hereinafter referred to as patent document 1) and Japanese Unexamined Patent Application Publication No. 2001-148514 (hereinafter referred to as patent document 2) propose a light emitting device which comprises an LED chip, a circuit board mounting the LED chip, a metal frame (e.g. made of aluminum) surrounding the LED chip on a surface of the circuit board, and an encapsulation member (e.g. made of a transparent resin such as an epoxy resin and a silicone resin) filled within the frame to encapsulate the LED chip and bonding wires connected to the LED chip. The frame disclosed in the Patent document 1 and 2 is shaped to have an opening area which becomes greater as it is spaced further away from the circuit board and is finished to have a mirror interior face which serves as a reflector reflecting a light emitted from the LED chip.

Further, the patent document 2 discloses the light emitting device configured to give a white luminescent spectrum by use of a blue LED chip with blue luminescence and a yellowish fluorescent material, which is dispersed in a transparent resin encapsulating the blue LED chip to realize the white color light emission by the light from the blue LED chip.)

When an epoxy resin is used as a material of the encapsulation member in the light emitting device, bonding wires may be cut off when subjected to a heat cycle test (temperature cycle test) of repeating a low temperature period of −40° C. and a high temperature period of 80° C. alternately, due to thermal-expansion of an electrically conductive pattern mounted on a substrate of a circuit board in the high temperature environment. In addition, when used as a material of the encapsulation member, the epoxy resin exhibits only lower weatherability than the silicone one.

On the other hand, when a silicone resin is used as a material of the encapsulation member in the light emitting device, the bonding wires can be prevented from being cut off in the high temperature period of the heat cycle test because of that the encapsulation member is gelatinous and elastic. However, since a linear expansion coefficient of the silicone resin, which is a material of the encapsulation member, is more than 10 times that of an aluminum which is a material of the frame, voids may be generated within the encapsulation member due to a difference in linear expansion coefficient between silicone resin and aluminum.

Furthermore, in the light emitting device, although the light emitted from the LED chip can be taken to external of the encapsulation member effectively by means of the frame with a mirror interior face, there is a failure of causing light loss resulting from the reflection of the light on the interior face of the frame.

Besides, in the light emitting device according to the Patent document 1, when a lens controlling an orientation of the light emitted from the LED chip is arranged over the encapsulation member and the frame, a light output may be lowered due to a deviation in an optical axis between the LED chip and the lens, resulting from dimensional inaccuracy of the flame and the lens or positioning inaccuracy thereof.

The Patent document 2 also discloses the light emitting device in which the encapsulating member of the LED chip and the bonding wires connected thereto are configured to have its portion shaped into a convex lens. However, the encapsulation member is likely to suffer from an external force to develop a stress transmittable to the LED chip and the bonding wires. The transmitted stress possibly acts to alter a luminescent characteristic of the LED chip and break the bonding wires, or bring transference of external moisture to the LED chip.

DISCLOSURE OF THE INVENTION

In view of the above problem, the present invention has been accomplished and has an object of providing a light emitting device and a method of manufacturing the same capable of improving a light output as well as its reliability.

The light emitting device of the present invention includes a light emitting diode (LED) chip, a mounting substrate to which the LED chip is mounted, an encapsulation member made of an encapsulation resin material to encapsulate the LED chip, and a lens molded from a transparent resin. The lens has a recess facing a surface of the mounting substrate, and is fixed on the mounting substrate such that the encapsulation member is set into the recess.

With the use of the lens made of the transparent resin surrounding the encapsulation member, a difference in linear expansion coefficient can be reduced between the encapsulation member and materials therearound, in contrast to a conventional scheme where a metal flame is used to surround the encapsulation member. Accordingly, the light emitting device can suppress generation of voids within the encapsulation member in a low temperature period of a heat cycle test, enabling to improve its reliability. As covering the encapsulation member, the lens made of the transparent resin can reduce a reflection loss to improve the light output, compared to the metal flame in the conventional scheme. The lens made of the transparent resin can reduce components or parts, and minimize the reduction of the light output due to a deviation of an optical axis between the LED chip and the lens.

It is preferred that the light emitting device of the present invention includes a color conversion member comprising a fluorescent material excited by a light from the LED chip to emit a light of a color different from a luminescent color of the LED chip. In this case, a mixed color (e.g. white color light) can be obtained by a mixture of the lights emitted from the LED chip and the fluorescent material.

Further, it is preferred that the color conversion member is disposed to cover the lens such that an air layer is formed between the color conversion member and a light output surface of the lens.

In this case, as being out of intimate contact with the lens, the color conversion member assures to avoid a lowered yield which would otherwise result from dimensional inaccuracy of the color conversion member or positioning inaccuracy thereof, and suppress stress transference from the color conversion member in response to an external force therein to the LED chip through the lens and the encapsulation member. Due to the presence of a space between the color conversion member and the lens, the lens is allowed to pass therethrough only a small fraction of the light scattering from the fluorescent particles within the color conversion member after being emitted from the LED chip to be incident on the color conversion member through the encapsulation member and the lens, thereby giving an improved light extraction efficiency to the device and suppressing transference of external moisture to the LED chip.

Furthermore, it is preferred that the lens is shaped to have the light output surface with convex curve such that an interface between the light output surface and the air layer is free from a total reflection of the light radiated from a light input surface facing the encapsulation member.

In this case, the light emitted from LED chip can easily travel to the color conversion member without suffering from the total reflection at the interface between the light output surface and the air layer, enabling to realize high light flux.

It is preferred that the color conversion member is shaped to have dome-shape.

In this case, it is possible to reduce color ununiformity.

Preferably, the mounting substrate comprises a heat conductive plate made of a heat conductive material, and a dielectric substrate stacked on the heat conductive plate, the dielectric substrate being provided on its surface opposite to the heat conductive plate with a pair of lead patterns for electrical connection respectively with electrodes of the LED chip. The dielectric substrate has a through-opening inside of which the LED chip is mounted to the heat conductive plate with a planar sub-mount member interposed therebetween. The sub-mount member has a larger size than the LED chip and thermally couples the LED chip to the heat conductive plate in order to relieve the stress applied to the LED chip due to a difference in linear expansion coefficient between the LED chip and the heat conductive plate.

In this case, the sub-mount member acts to efficiently radiate a heat, generated in the LED chip, through the sub-mount member and the heat conductive plate, and relieve the stress applied to the LED chip due to the difference in linear expansion-coefficient between the LED chip and the heat conductive plate.

Preferably, the sub-mount member is designed to have a thickness such that a surface of the LED chip facing the sub-mount member is spaced from the heat conductive plate by a distance greater than that between the heat conductive plate and an edge of the color conversion member opposed to the mounting substrate.

In this instance, the light emitted from a lateral side of the LED chip can be prevented from leaking out through a juncture between the color conversion member and the mounting substrate.

A method of manufacturing the light emitting device is preferred to include the followings steps.
(a) the step of covering the LED chip with an uncured first encapsulation resin material which becomes one part of the encapsulation member, subsequent to the step of mounting the LED chip to the mounting substrate;
(b) the step of pouring at the recess of the lens an uncured second encapsulation resin material, which is the same material as the first one and becomes the other part of the encapsulation member, and the step of mounting the LED chip to the mounting substrate such that the LED chip covered with the first encapsulation resin material is set into the recess;
(c) the step of curing each of the first and second encapsulation resin materials to form the encapsulation member.

With this method, the encapsulation member can hardly suffer from generation of voids in the manufacturing process.

Preferably, the lens is formed with an injection port for pouring the encapsulation resin material into the recess, and also with a discharge port for discharging the excess of the encapsulation resin material.

Further, the method of manufacturing the light emitting device in the present invention may include the following steps.

(a) the step of fixing the lens on the mounting substrate such that the LED chip is set into the recess of the lens, subsequent to the step of mounting the LED chip to the mounting substrate;
(b) the step of filling the recess of the lens with the uncured encapsulation resin material through the injection port of the lens;
(c) the step of curing the encapsulation resin material to form the encapsulation member.

Also with this method, the encapsulation member can hardly suffer from generation of the voids in the manufacturing process.

Besides, the method of manufacturing the light emitting device may include the following steps.
(a) the step of covering the LED chip with the uncured first encapsulation resin material which becomes one part of the encapsulation member, subsequent to the step of mounting the LED chip to the mounting substrate;
(b) the step of fixing the lens on the mounting substrate such that the LED chip covered with the first encapsulation resin material is set into the recess of the lens;
(c) the step of filling the recess of the lens through the injection port of the lens with the uncured second encapsulation resin material, which is the same material as the first one and becomes the other part of the encapsulation member;
(d) the step of curing each of the first and second encapsulation resin materials to form the encapsulation member.

With this method, the encapsulation member can hardly suffer from generation of the voids in the manufacturing process.

BEST MODE FOR CARRYING OUT THE INVENTION

Hereafter, the invention will be explained in detail with reference to the attached drawings.

First Embodiment

Figure 1:
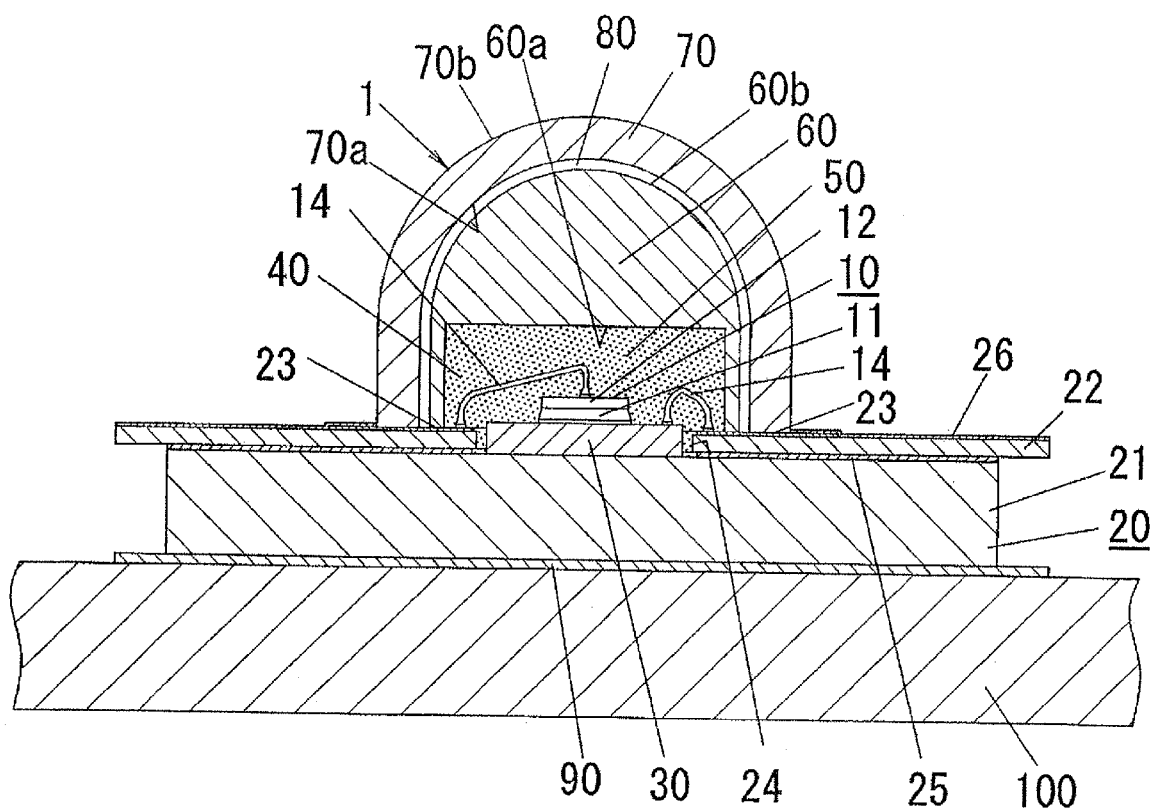
FIG. 1 is a cross sectional view of a light emitting device in accordance with a first embodiment.
Figure 2:
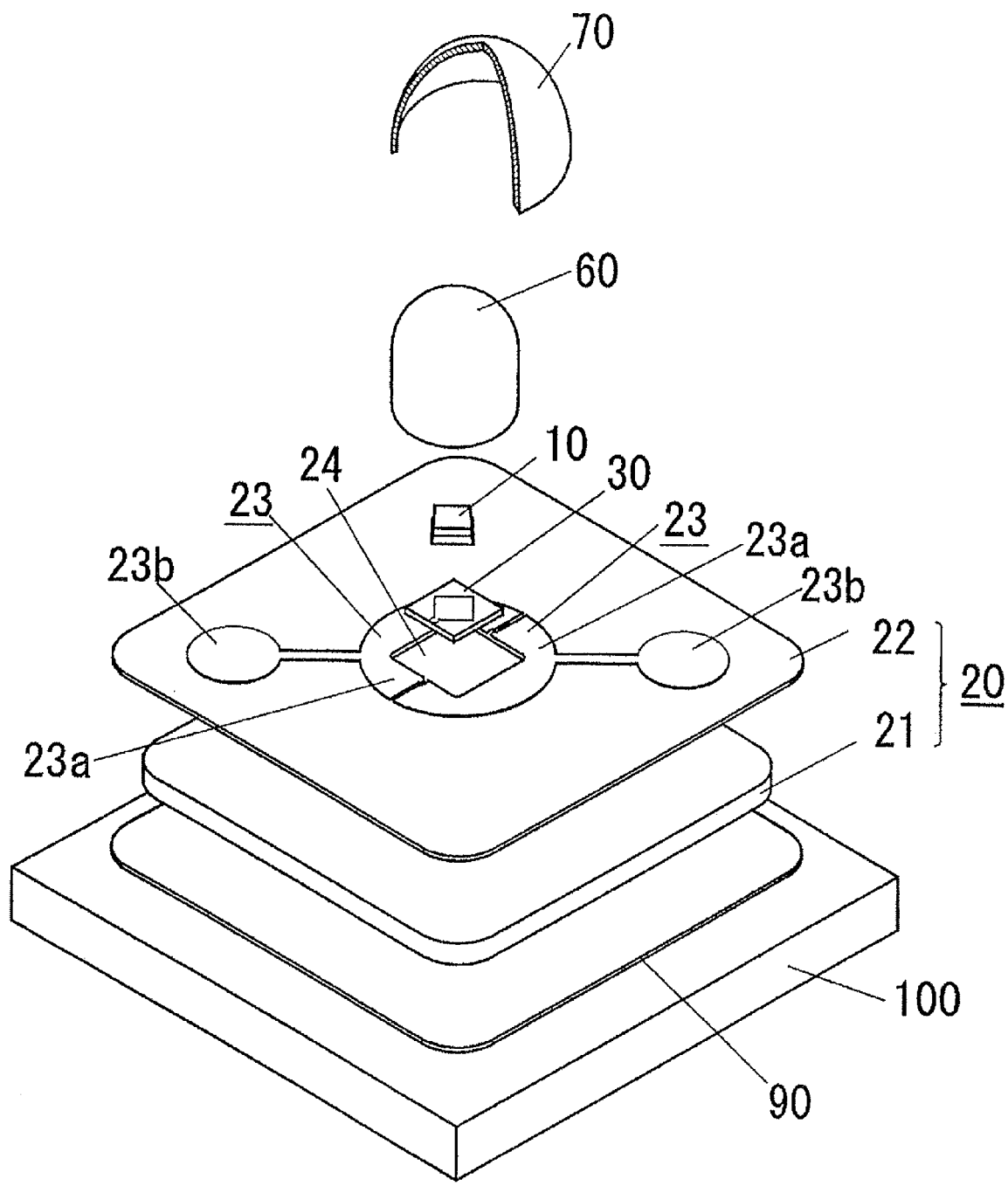
FIG. 2 is an exploded perspective view of the above light emitting device with a portion broken away.
Figure 3:
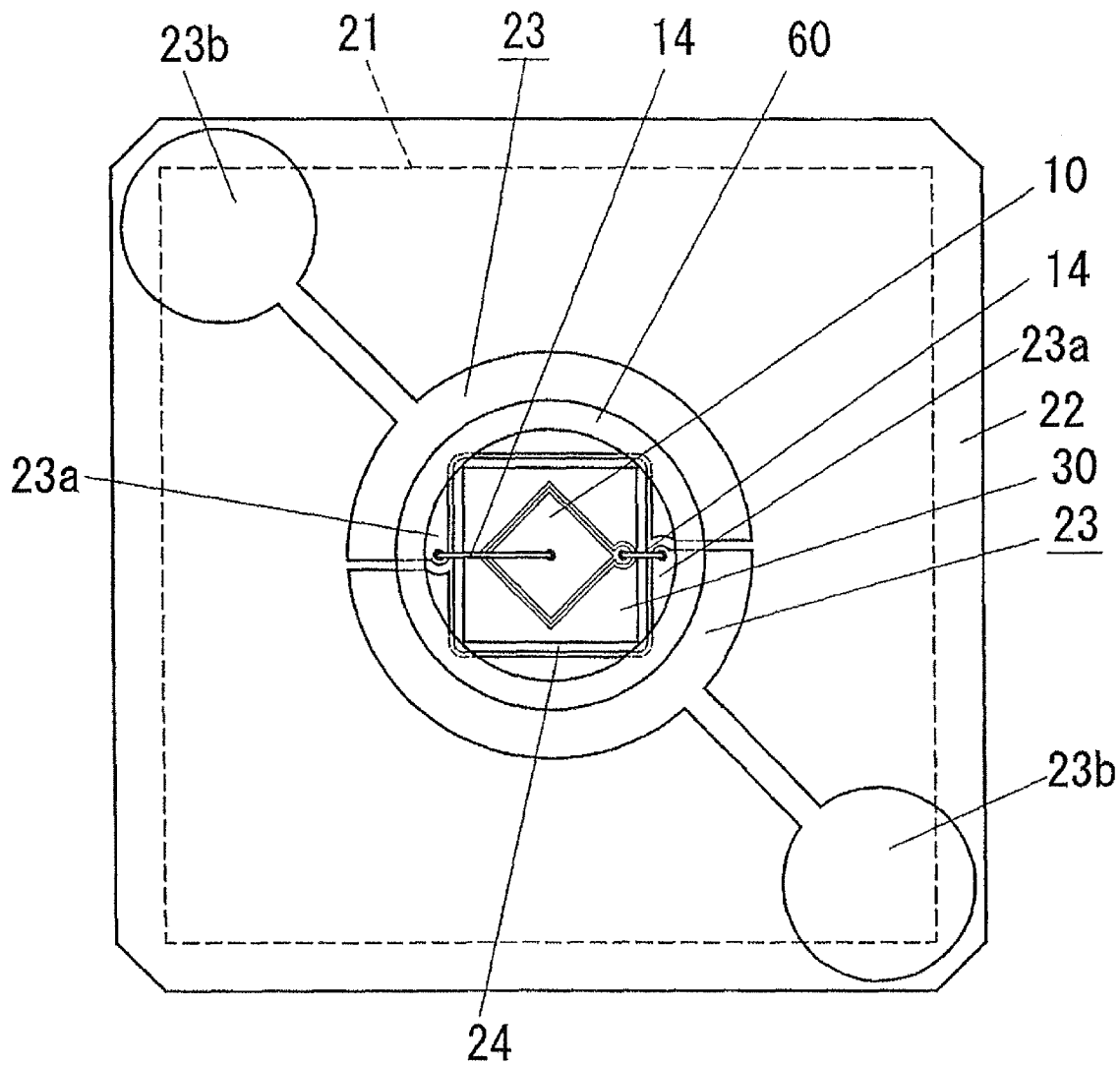
FIG. 3 is a plan view of an essential part of the above light emitting device.

As shown in FIGS. 1 to 3, the light emitting device 1 of the present embodiment includes an LED chip 10, a mounting substrate 20 to which the LED chip 10 is mounted, an encapsulation member 50 which is elastic and formed of an encapsulation resin material to encapsulate the LED chip 10 and bonding wires 14 connected to the LED chip 10, a lens 60 formed of a transparent resin material, a dome-shaped color conversion member 70 mounted on the mounting substrate 20 to cover a light output surface 60b of the lens 60. The color conversion member 70 is molded from a transparent material and a fluorescent material which is excited by a light from the LED chip 10 to emit a light of a color different from a luminescent color of the LED chip 10. The lens 60 has a recess 40 facing a surface of the mounting substrate 20, and is fixed on the mounting substrate 20 such that the encapsulation member 50 is set into the recess 40. The color conversion member 70 is arranged to cover the lens 60 such that an air layer 80 is formed between the color conversion member 70 and the light output surface 60b of the lens 60.

The light emitting device 1 of the present embodiment is adapted in use, for example, as a light source of an illumination appliance, and is mounted to a metal body 100 of the appliance (e.g. the metal with a high thermal conductivity such as Al, Cu) through a dielectric layer 90 made of, for example, a green sheet. As being mounted to the metal body 100 of the appliance, a thermal resistance from the LED chip 10 to the body 100 can be lowered to improve heat-dissipation capability. Further, since a temperature rises at a junction of the LED chip 10 can be restrained, an increased input power is available to give a high light output. It is noted in this connection that, when the light emitting device 1 is used for the illumination appliance, a plurality of the light emitting devices 1 may be mounted to the metal body 100 of the appliance in order to obtain an intended output light power with the light emitting devices 1 being connected in series or parallel with each other.

Figure 5A:
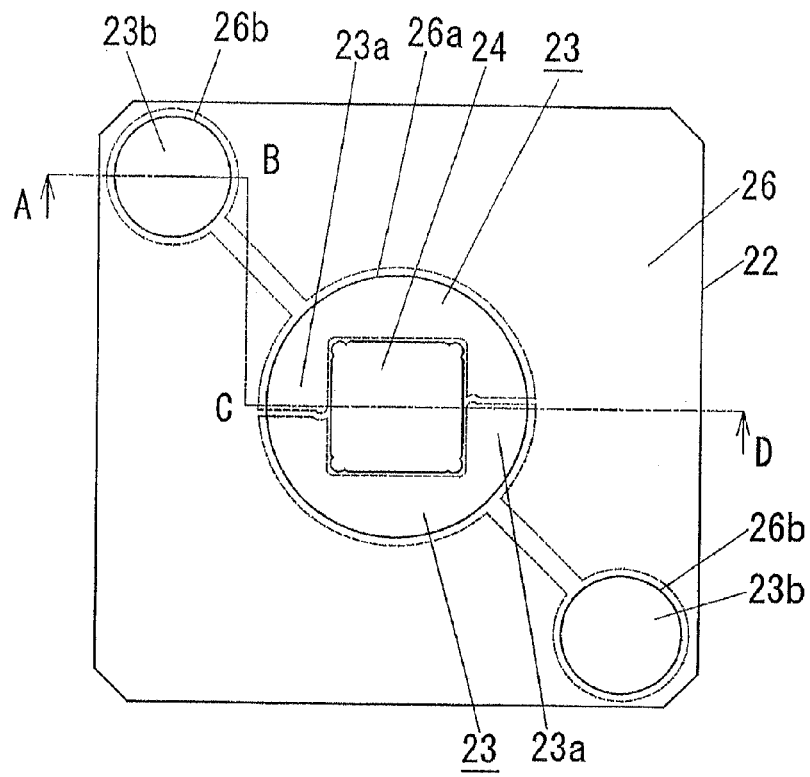
FIG. 5A is a plan view of a dielectric substrate utilized in the above light emitting device.
Figure 5B:
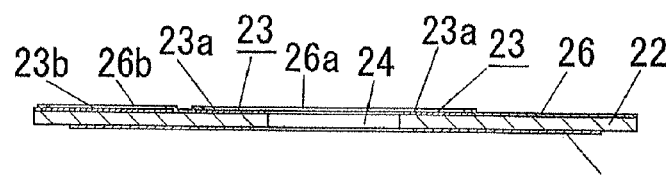
FIG. 5B is a cross sectional view of the above dielectric substrate taken along line A-B-C-D in FIG. 5A.
Figure 5C:
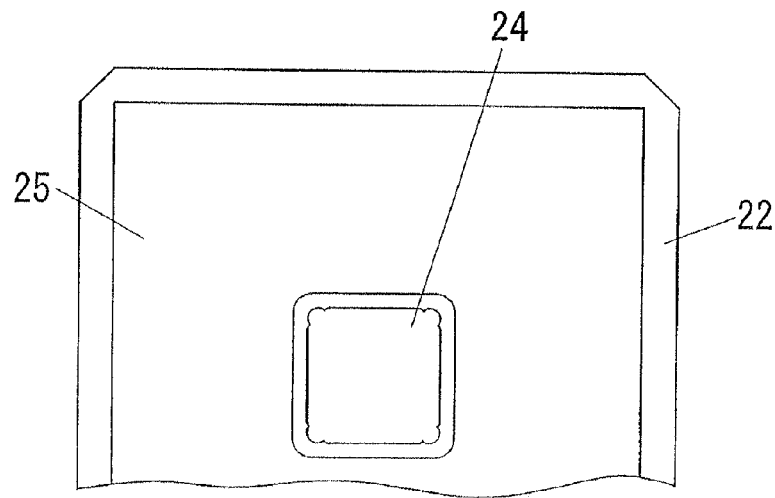
FIG. 5C is a partly broken away bottom view of the above dielectric substrate of FIG. 5A.

The mounting substrate 20 includes a metal plate (heat conductive plate) 21 made of a thermal-conductive material and a dielectric substrate 22 made of a glass epoxy (FR4) board and superimposed on the metal plate 21. Although the metal plate 21 is made of Cu in the present embodiment, it may be made of another metal having a relatively high thermal conductivity such as Al. The metal plate 21 is secured to the dielectric substrate 22 by means of a conjugative metal layer 25 (see, FIG. 1 and FIG. 5B, FIG. 5C.) which is made of a metallic material (in this embodiment, Cu) deposited on the surface of the dielectric substrate 22 opposed to the metal plate 21.

The dielectric substrate 22 includes a pair of lead pattern 23 coupled electrically to both electrodes (not shown) of the LED chip 10 on a surface opposed to the metal plate 21, and is formed with through-opening 24 at a position corresponding to the LED chip 10.

The LED chip 10 is mounted to the metal plate 21 with a sub-mount member 30 interposed therebetween inside the through-opening 24. The sub-mount member 30 is shaped into a rectangular plate which is dimensioned to be larger than the LED chip 10, and thermally couples the LED chip 10 to the metal plate 21 in order to relieve a stress applied to the LED chip 10 due to a difference in linear expansion coefficient between the LED chip 10 and the metal plate 21. A heat generated in the LED chip 10 is transmitted to the metal plate 21 not through the dielectric substrate 22. The sub-mount member 30 has a thermal conductive performance so as to radiate the heat generated in the LED chip 10 to the metal plate 21 over a wider area than the chip size of the LED chip 10. Since the LED chip 10 is thus mounted to the metal plate 21 with the sub-mount member 30 interposed therebetween in the present embodiment, the heat generated in the LED chip 10 can be radiated efficiently through the sub-mount member 30 and the metal plate 21, while it is made to relieve the stress applied to the LED chip 10 due to the difference in linear expansion coefficient between the LED chip 10 and the metal plate 21.

In the embodiment, although AlN is adopted as a material of the sub-mount member 30 because of its relatively high thermal conductivity and insulating performance, the material of the sub-mount member 30 is not limited to AlN, and may be one (e.g. composite SiC, Si, or and the like) having the linear thermal expansion coefficient relatively close to that of an electrically-conductive substrate 11 made of 6H—SiC, and relatively high thermal conductivity.

Further, the sub-mount member 30 includes a reflecting film (e.g. laminate of Ni film and Ag film) formed around a conductive pattern 31 to reflect the light emitted from the LED chip 10.

Each lead pattern 23 is provided as a laminate of Cu film, Ni film, and Ag film. A resist layer 26 (see FIG. 1 and FIG. 5A, FIG. 5B) made of a whitish resin is superimposed on a surface of the dielectric substrate 22 away from the metal plate 21 to cover each lead pattern 23. The resist layer 26 is formed in its center with a circular opening 26a at a center in order to expose inner leads 23a of each lead pattern 23, and at its corners respectively with circular openings 26b in order to expose outer leads 23b of each lead patterns 23.

Figure 4:
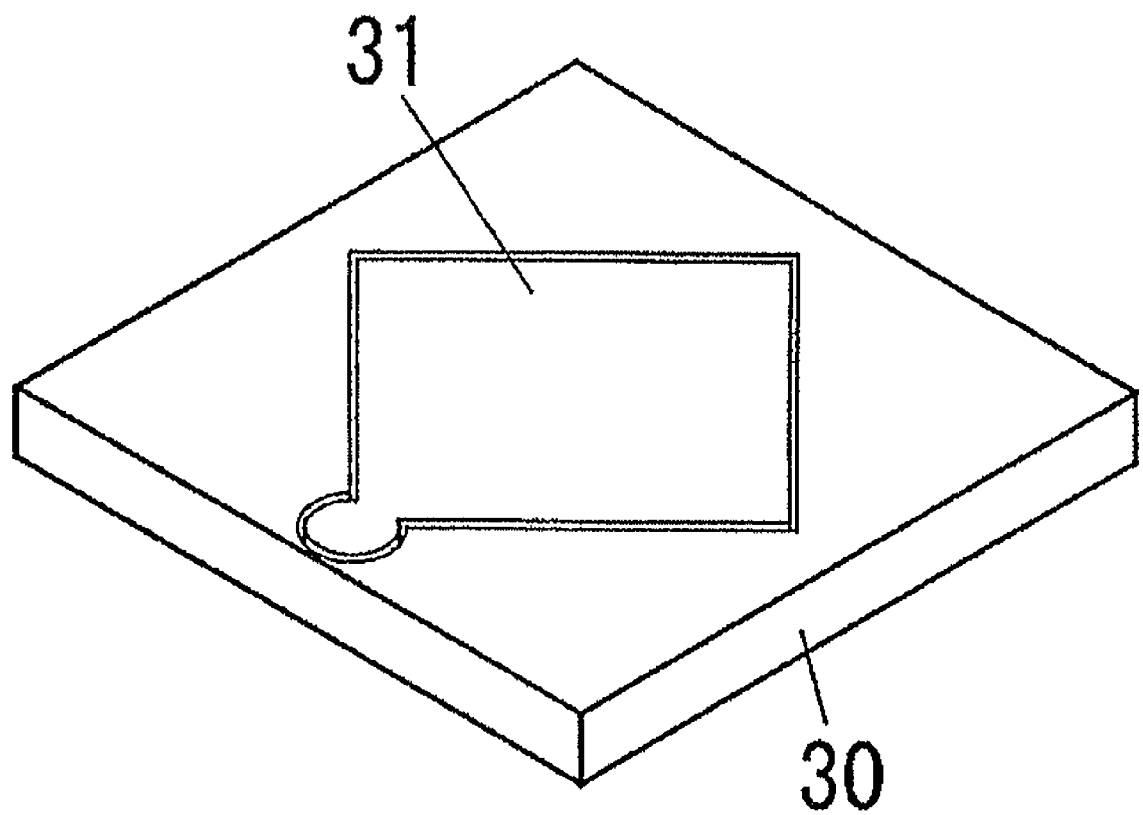
FIG. 4 is a perspective view of a sub-mount member utilized in the above light emitting device.

The LED chip 10 is a GaN-based blue LED chip emitting a blue light. The LED chip 10 includes the electrically conductive substrate 11 made of an electrically conductive n-type SiC having a lattice constant and a crystalline structure closer to those of GaN than sapphire. Formed on the main surface of the electrically conductive substrate 11 is a light emitting part 12 which is made of GaN-based semiconductor material and is obtained by an epitaxial growth (e.g. MOVPE process) to have a laminated structure, e.g. double-hetero structure. A cathode electrode (n-type electrode) (not shown) is formed on the rear side of the electrically conductive substrate 11 as an electrode on the side of the cathode. An anode electrode (p-type electrode) (not shown) is formed on the surface (a frontmost surface of the principle surface of the conductive substrate 11) of the light emitting part 12 as an electrode on the side of the anode. In short, the LED chip has the anode electrode on its one surface, and the cathode electrode on the other surface. The sub-mount member 30 has the conductive pattern 31 on a surface facing the LED chip 10 (as shown in FIG. 4). The LED chip 10 has the cathode electrode electrically contacted to one of the lead patterns 23 through the conductive pattern 31 and through the bonding wires 14 (e.g. gold thin wire, aluminum thin wire, and the like), and has the anode electrode electrically connected to the other lead pattern 23 through the bonding wires 14.

Although the cathode electrode and the anode electrode are each composed of the laminate of Ni film and Au film in the embodiment, materials of the cathode electrode and the anode electrodes are not particularly limited, and may be one having a good ohmic property (e.g. Al and the like). Further, the present embodiment illustrates that the LED chip 10 is mounted to the metal plate 21 with the light emitting part 12 of the LED chip 10 being spaced further away from the metal plate 21 by way of the sub-mount member 30 than from the electrically conductive substrate 11. However, it is equally possible to mount the LED chip 10 to the metal plate 21 with the light emitting part 12 being closer to the metal plate 21 than the electrically conductive plate 11. Although it is desirable to space the light emitting part 12 away from the metal plate 21 from a viewpoint of optical extraction efficiency, the close disposition of the light emitting part 12 to the metal plate 21 does not increase the optical extraction loss because of that the electrically-conductive substrate 11 and the light emitting part 12 have the refractive index of the same level in the present embodiment.

It is noted in this connection that, although the LED chip 10 and the sub-mount member 30 can be joined by a solder such as SnPb, AuSn, SnAgCu, or a silver paste, they are preferably joined by use of a lead free solder such as AuSn, SnAgCu.

The encapsulation resin material for the encapsulation member 50 is made of a silicone resin in this embodiment. The material of the encapsulation member 50 is not limited to the silicone resin, but may be made of another resin, e.g. an acrylic resin.

The lens 60 is a molded item with convex lens-shaped, having the light output surface 60b with convex curve, and includes the recess 40 at its bottom surface as mentioned above. The upper surface (shown in FIG. 1) of the recess 40, i.e. an light input surface 60a of the lens 60, is shaped into plane.

The lens 60 is molded from the transparent resin (i.e. silicon resin in this embodiment), and has the same refractive index and coefficient of linear expansion as the encapsulation member 50. It is desirable that the lens 60 is molded from the transparent resin having refractive index and coefficient of elasticity equal to or higher than those of the encapsulation resin material for the encapsulation member 50. For instance, when an acryl resin is used as the encapsulation resin material, the lens 60 may be molded together with the acryl resin. In addition, it is desirable that the transparent resin material of the lens 60 has the same coefficient of linear expansion as the encapsulation resin material.

Preferably, the light output surface 60b of the lens 60 is shaped into a convex surface such that an interface between the light output surface 60b and the air layer 80 is free from a total reflection of the light radiated from the light input surface 60a. In this embodiment, the light output surface 60b is formed of a part of a sphere surface, and the lens 60 is disposed such that the center of the light output surface lies on a line passing through a center of the light emitting part 12 along thickness direction of LED chip 10. In other words, the lens 60 is arranged such that an optical axis of the lens 60 coincides with the line passing through the center of the light emitting part 12 along thickness direction of LED chip 10. After the light is emitted from LED chip 10 and then received at the light input surface 60a of the lens 60, this arrangement makes it possible for the interface between the light output surface 60b and the air layer 80 to be free from the total reflection of light. Therefore, the light can easily travel to the color conversion member 70, enabling to realize high light flux.

The color conversion member 70 is molded from a mixture of a transparent material, e.g. silicone resin and a particulate yellowish fluorescent material which is excited by the blue light from the LED chip 10 to emit a broad-band yellowish light (that is, the color conversion member 70 includes a fluorescent material). In the light emitting device 1 of this embodiment, the blue light from LED chip 10 and the light from the yellowish fluorescent material are emitted through the outer surface 70b of the color conversion member 70 to obtain white color light.

The color conversion member 70 is secured at a periphery of its opening side to the mounting substrate 20 by an adhesive agent (e.g. silicone resin, epoxy resin) such that the air layer 80 is formed between the color conversion member 70 and the light output surface 60b of the lens 60. The color conversion member 70 is shaped to fit to the light output surface 60b of the lens 60 such that an inner surface 70a of the color conversion member 70 is spaced from the light output surface 60b of the lens 60 by an almost uniform distance, and configured to have a constant wall thickness over the entire surface.

The air layer 80 is formed between the color conversion member 70 and the lens 60 to reduce the likelihood of contact between the lens 60 and the color conversion member 70 transformed by an external force therein. Accordingly, the air layer enables the LED chip 10 and respective bonding wires 14 to be free from a stress which is generated in the color conversion member 70 in response to an external force and then transferred through the lens 60 and the encapsulation member 50, leading to improving reliability. In addition, with the air layer 80 provided between the color conversion member 70 and the lens 60, transference of external moisture to the LED chip 10 can be suppressed. Further, as being out of intimate contact with the lens 60, the color conversion member 70 assures to avoid a lowered yield which would otherwise result from dimensional inaccuracy of the color conversion member 70 or positioning inaccuracy thereof. In the light emitting device 1 of this embodiment, the color conversion member 70 is finally assembled, thus can be selected to have an appropriate ratio of the fluorescent material to the transparent resin in match with the wavelength of the light from LED chip 10, thereby suppressing a color unevenness of the lights emitted from the finished products of the light emitting device 1. In addition, the dome-shaped color conversion member 70 enables to suppress the color unevenness by means of a constant wall thickness of the color conversion member 70.

Due to the presence of the air layer 80 between the color conversion member 70 and the lens 60, the lens 60 is allowed to pass therethrough only a small fraction of the light scattering from the yellowish fluorescent particles within the color conversion member 70 after being emitted from the LED chip 10 to be incident on the color conversion member 70 through the encapsulation member 50 and the lens 60, thereby giving an improved light extraction efficiency to the device.

Figure 6A:
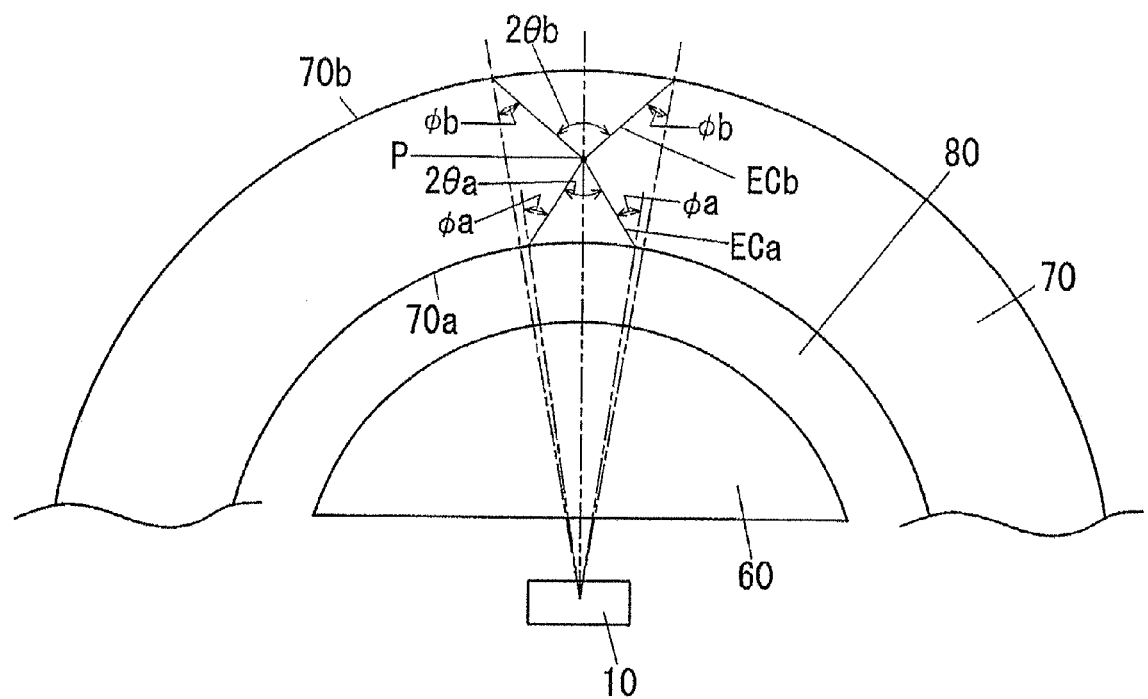
FIG. 6A is an explanation view of an essential part of the above light emitting device.
Figure 6B:
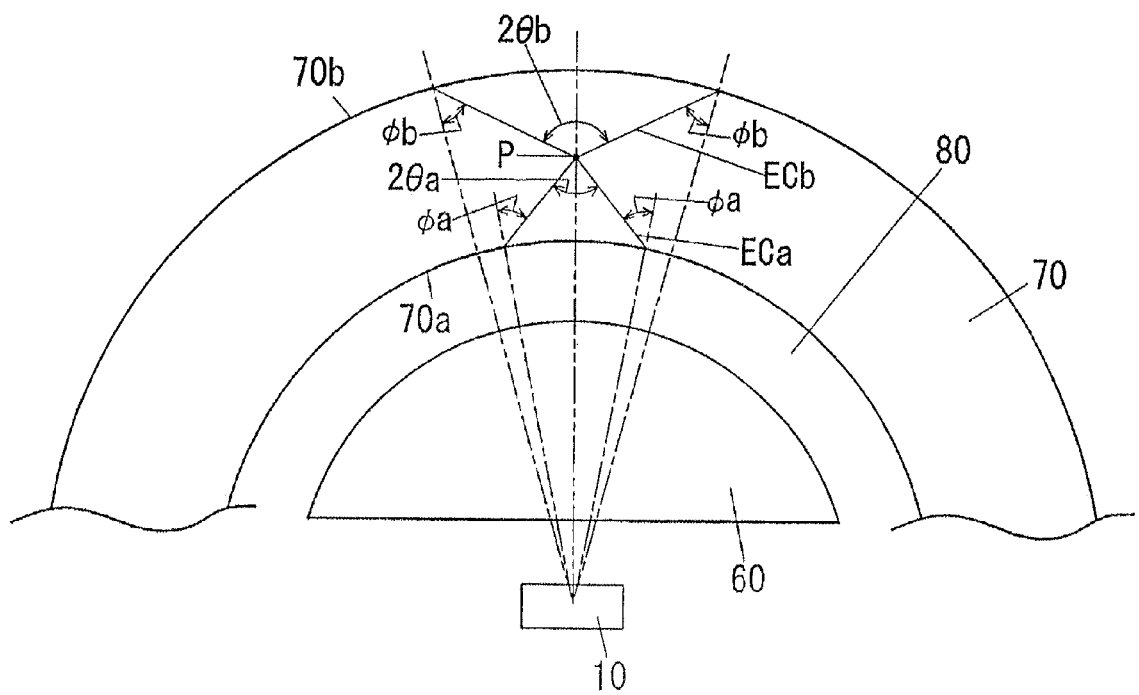
FIG. 6B is an explanation view of an essential part of the above light emitting device.

With reference to FIGS. 6A and 6B, an explanation is made to a condition where the blue light from the LED chip 10 is scattered in all the directions at a center point P of the color conversion member 70 along an optical axis aligned with the optical axis of the LED chip 10. In this condition, the light is scattered towards the inside face of the color conversion member 70 at a spread angle $2\theta a$ within an escape cone ECa on the inside surface 70a, while it is scattered towards the outside face of the color conversion member 70 at a spread angle $2\theta b$ within an escape cone ECb on the outside surface 70b. The spread angles of $2\theta a=60°$ and $2\theta b=98°$ are given when the total internal reflection angles $\Phi a$, $\Phi b=40°$, as shown in FIG. 6A, while the spread angles of $2\theta a=76°$ and $2\theta b=134°$ are given when the total internal reflection angles $\Phi a$, $\Phi b=50°$, as shown in FIG. 6B. The total internal reflection angle $\Phi a$ is measured at an interface between the color conversion member 70 and the air layer 80, while the total internal reflection angle Φb is measured at an interface between the color conversion member 70 and an air of the outside medium. When using the transparent material of refractivity (n) for the color conversion member 70, a maximum emitting efficiency (η) of the blue light scattered at the point P and directed through the escape cone ECa on the inside face 70a is expressed as $\eta=(1/4n^2)\times100(\%)$. Thus, η≈13% when using the silicone resin having a refractivity (n) of 1.4 for the transparent material as described in the above. That is, with the interposition of the air layer 80 between the color conversion member 70 and the lens 60, only 13% of the blue light scattered at point P is reflected back to the lens 60, in contrast to that as much as 50% of the blue light scattered at the point P is reflected back to the lens 60 in the absence of the air layer. Accordingly, the light extraction efficiency is improved while restricting deterioration of the encapsulating member 50 due to the blue light. In order to lessen the blue light reflected back through the escape cone ECa, the color conversion member 70 is preferred to have an increased thickness.

As the material of the color conversion member 70, the transparent material is not limited to the silicone resin, and may be another such as acryl resin, epoxy resin, and glass. Additionally, the fluorescent material mixed with the transparent material of the color conversion member 70 is not limited to the yellowish fluorescent material. For instance, the white color light can be obtained by a mixture of other fluorescent materials such as reddish and greenish ones.

In order to prevent a leakage of the light emitted from the lateral side of the LED chip 10 through a juncture between the color conversion member 70 and the mounting substrate 20 (i.e., prevent the blue light from the LED chip 10 from emitting outwardly not through the color conversion member 70), it is preferred that the surface of the LED chip 10 facing the sub-mount member is spaced further away from the metal plate 21 than an edge of the color conversion member 70 adjacent to the mounting substrate. For this purpose, the present embodiment is configured to select the thickness of the sub-mount member 30 such that the surface of the LED chip adjacent to the sub-mount member is spaced further away from the metal plate than the edge of the color conversion member. In more detail, the thickness of sub-mount member 30 is adjusted such that the bottom of the LED chip 10 is spaced away from the uppermost surface (a surface of the resist layer 26) of the mounting substrate 20 in a direction normal to the surface plane thereof.

Next, an explanation is made as to a method of manufacturing method the light emitting device 1 in accordance with the present invention.

Figure 7:
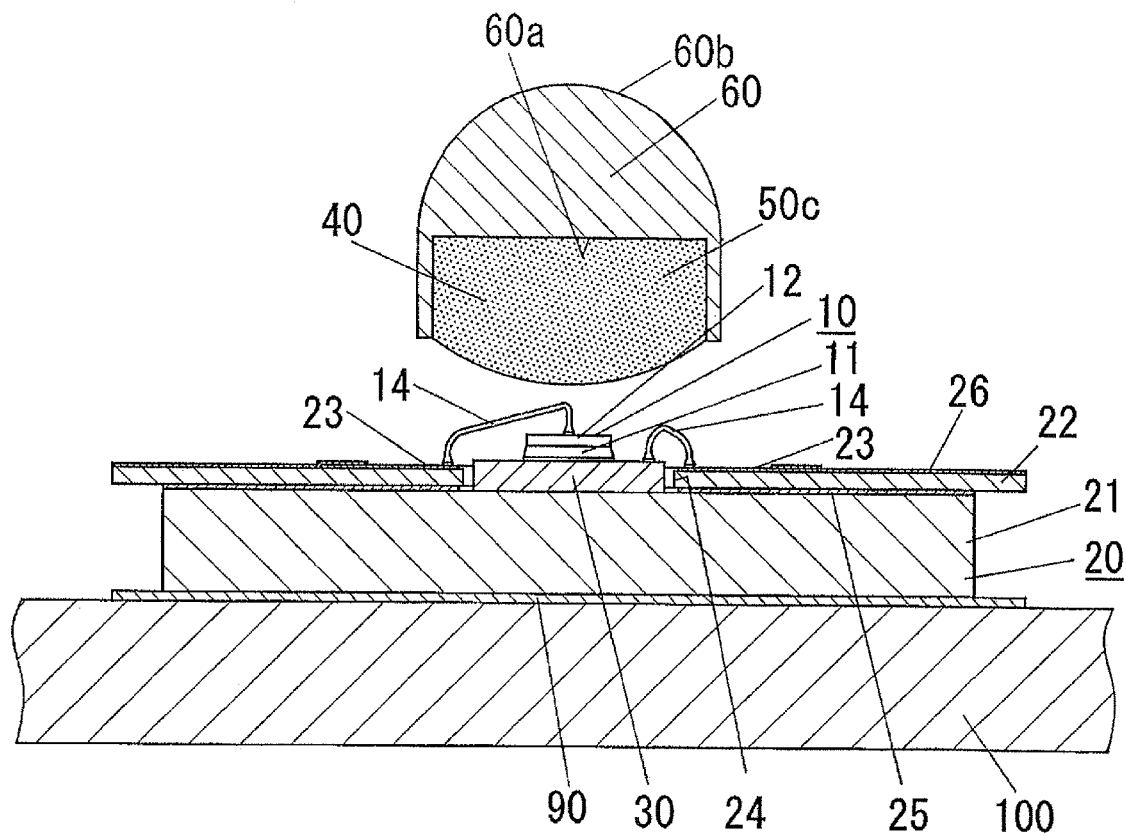
FIG. 7 is an explanation view illustrating a method of manufacturing the above light emitting device.

As shown in FIG. 7, the lighting device 1 could be manufactured by one method in which the LED chip 10 is firstly connected to the bonding wires 14, then the recess 40 of the lens 60 is filled with a liquid encapsulation resin material (e.g. silicone resin) 50c which forms the encapsulation member 50 later on, and subsequently the encapsulation resin material is cured to form the encapsulation member 50 with the lens 60 held in position on the mounting substrate 20. However, such method would suffer from generating voids in the encapsulation member 50.

Figure 8:
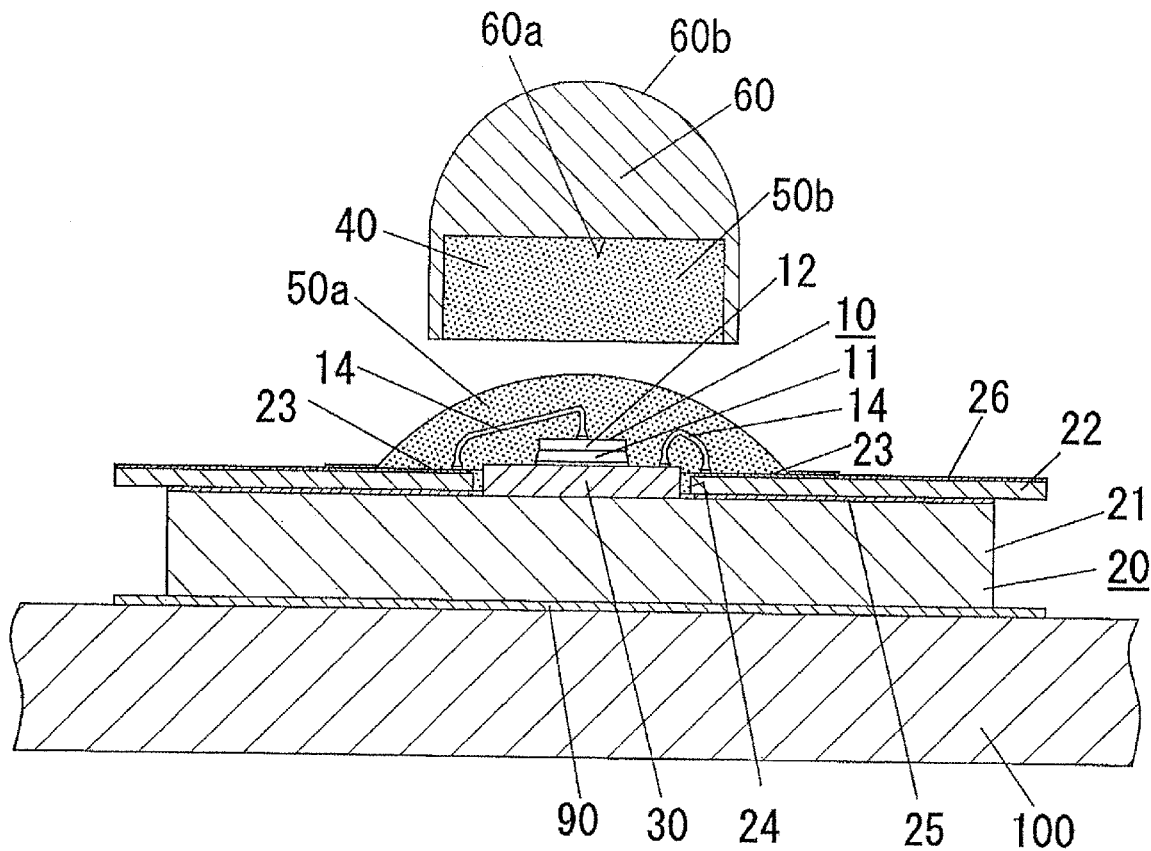
FIG. 8 is an explanation view illustrating a method of manufacturing the above light emitting device.

In view of this, the manufacturing method of the present embodiment is preferred to include the following steps. Firstly, the LED chip 10 is mounted to the mounting substrate 20 to be connected thereto by means of the bonding wires 14, as shown in FIG. 8, and then the LED chip 10 and the bonding wires 14 are covered with a liquid (uncured) first encapsulation resin material (for example, silicone resin) 50a which becomes one part of the encapsulation member 50 (step (a)). Next, a liquid (uncured) second encapsulation resin material (for example, silicone resin) 50b, which is made of the same as the first encapsulation resin material 50a and becomes the other part of the encapsulation member 50, is injected into the recess 40 of the lens 60, and then the lens 60 is mounted on the mounting substrate 20, such that the LED chip 10 and the bonding wires 14 covered with cured the first encapsulation resin material are confined in the recess 40 (step (b)). After that, each of the encapsulation resin materials 50a, 50b are cured to form the encapsulation member 50 (step (c)).

With this method, the encapsulation member 50 can hardly suffer from generation of the voids in the manufacturing process. The first encapsulation resin material 50a may be cured up to a certain extent before the step of pouring the second encapsulation resin material 50b. In this case, the void confined within the recess is highly likely to come out due to lowered viscosity of the first encapsulation resin material 50a.

In the present embodiment, the circular-shaped opening 26a formed in a center part of the resist layer 26 on the mounting substrate 20 is configured to have an inner diameter which is slightly larger than a maximum outer diameter of the color conversion member 70, and a portion of the first encapsulation resin material 50a flows into the interior of the opening 26a while being potted so as to be utilized as an adhesive for securing the color conversion member 70 to the mounting substrate 20.

Since the lens 60 made of the transparent resin material is arranged to surround the encapsulation member 50 in the light emitting device 1 of this embodiment, the generation of voids within the encapsulation member can be suppressed in a low temperature period of a heat cycle test for a small difference in linear expansion coefficient between the encapsulation member 50 and the lens 60, enabling to improve reliability and light output. The lens made of the transparent resin can reduce components or parts, and minimize the reduction of the light output due to a deviation of an optical axis between the LED chip 10 and the lens 60.

Figure 9:
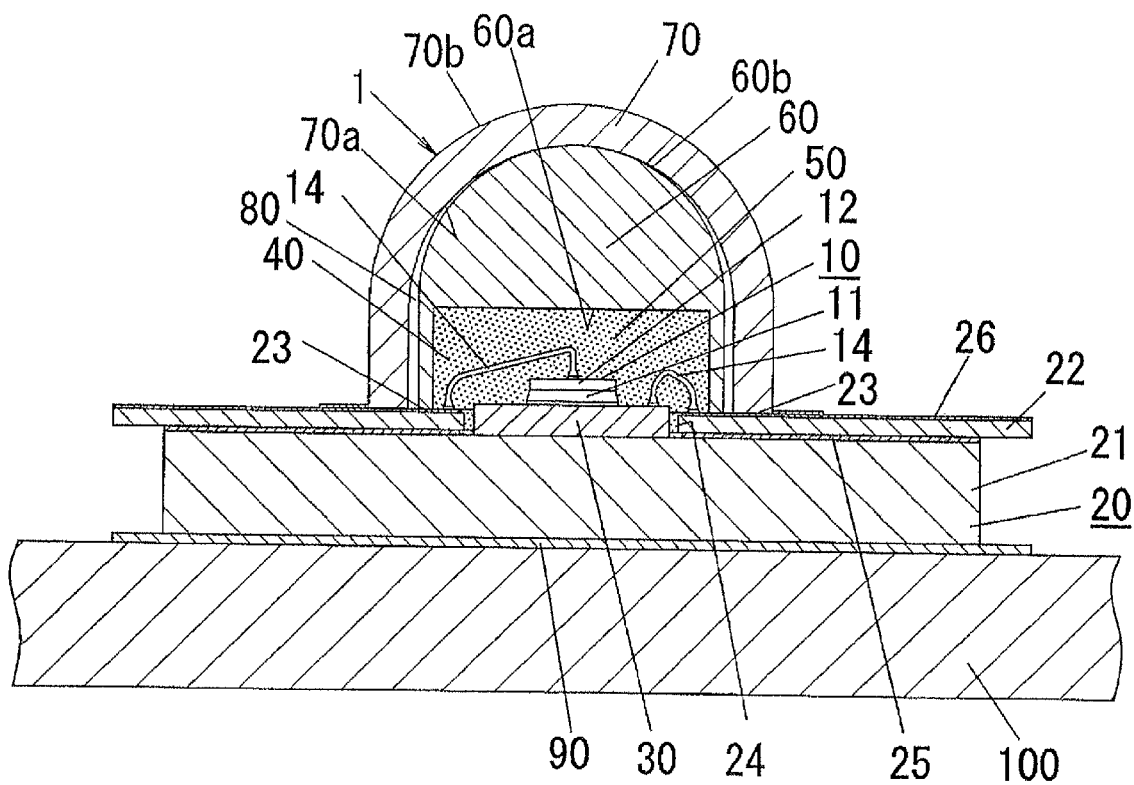
FIG. 9 is another configuration of the above light emitting device.

In this embodiment, although the inner surface 70a of the color conversion member 70 is spaced from the light output surface 60b of the lens 60 by an almost uniform distance, the light output surface 60b of the lens 60 may partially contact with the inner surface 70a of the color conversion member 70, as shown in FIG. 9. In this embodiment, the lens 60 is secured with a gelatinous resin, such as silicone resin. In general, the gelatinous resin has a low glass transition point (Tg), and would be soft and reduce its viscosity in high temperature, that is, the lens 60 can be lost by an external force in high temperature, depending on the environment. Accordingly, the lens 60 confined within inner space of the color conversion member 70 can be prevented from coming off by means of partial contact of the lens 60 with the color conversion member 70, as shown in FIG. 9. With this arrangement, the LED chip comes close to the color conversion member 70, enabling to reduce the size of the emitting part for realizing white color light, and thereby making it easy to design the lens controlling an orientation of the light. In order to achieve the effects, the clearance is set in the range of 0 to 0.1 mm between the light output surface 60b of the lens 60 and the inner surface 70a of the color conversion member 70.

Second Embodiment

Figure 10:
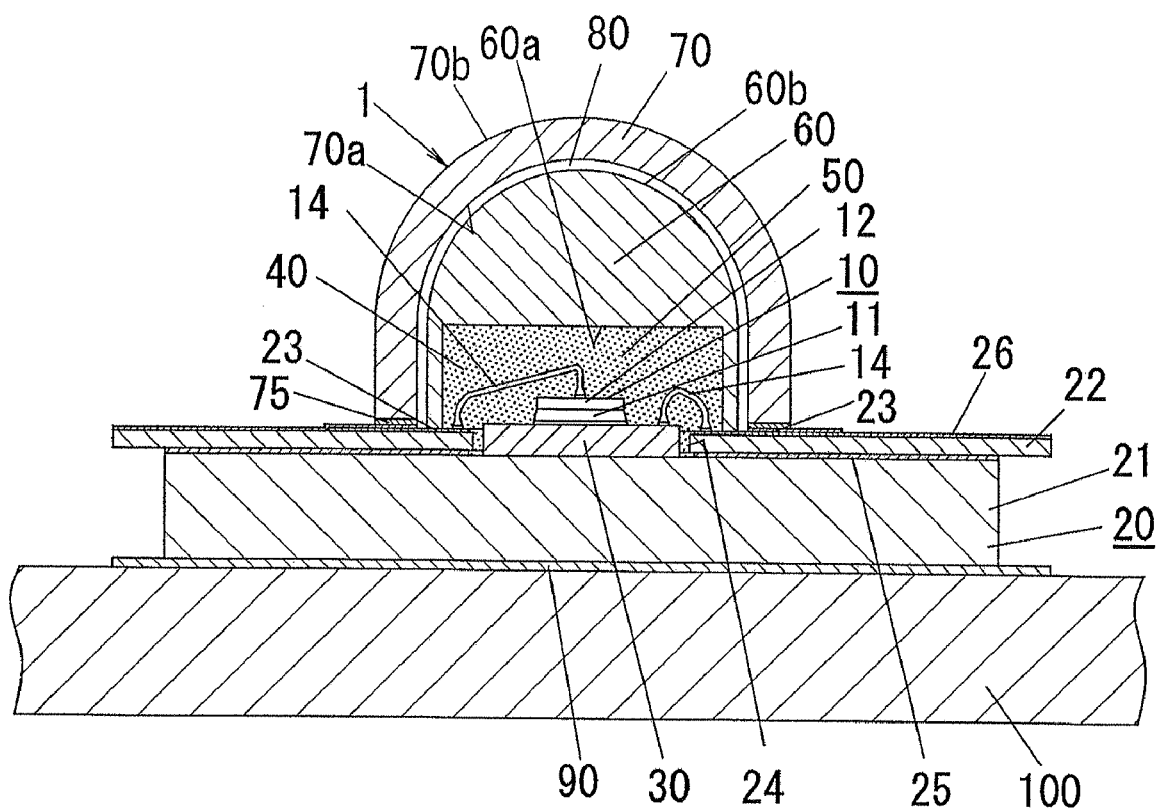
FIG. 10 is a cross sectional view of a light emitting device in accordance with a second embodiment.

The light emitting device 1 of this embodiment shown in FIG. 10 is almost consistent in fundamental component with that of first embodiment. Like components are designated by like reference numerals, and no duplicate explanation deemed necessary.

In this embodiment, the inner diameter of the circular-shaped opening 26*a* formed in a center part of the resist layer 26 is set slightly smaller than the maximum of inner diameter of the color conversion member 70, the color conversion member 70 is mounted on the mounting substrate 20 with its entire circumference joined to the periphery of circular-shaped opening 26*a* by an adhesive agent 75.

Figure 11:
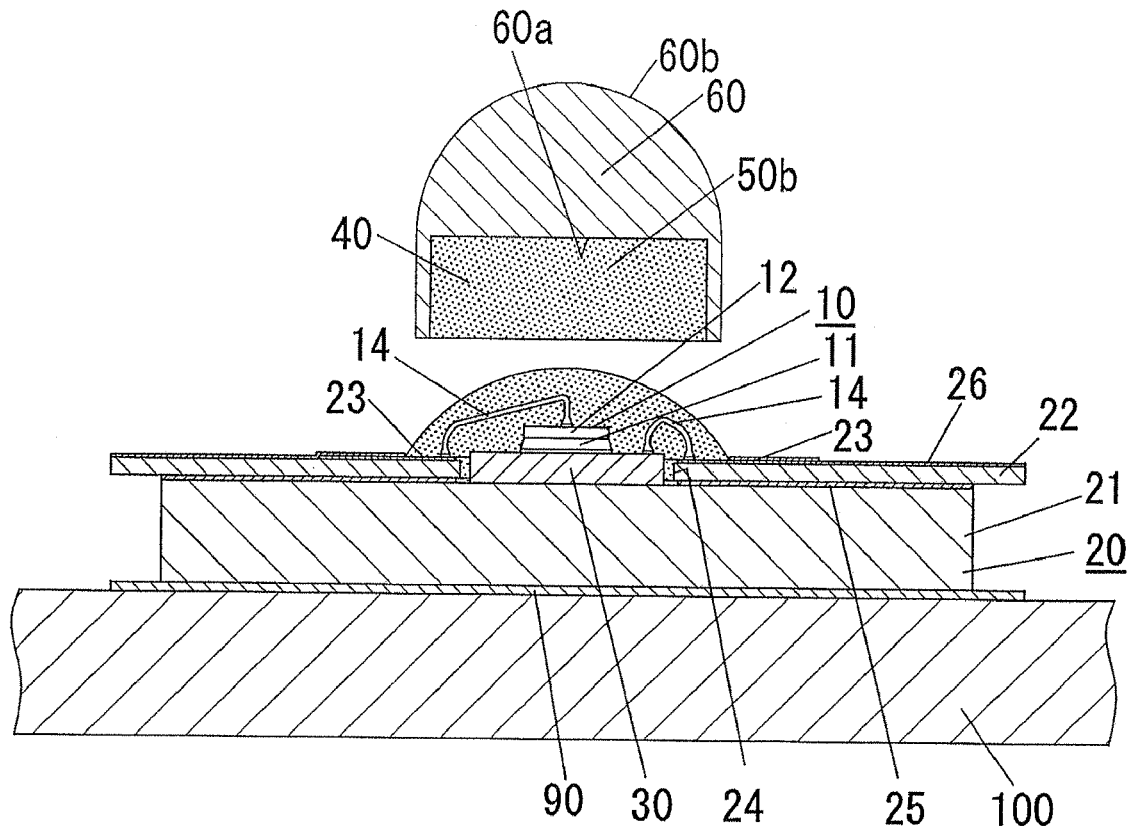
FIG. 11 is an explanation view illustrating a method of manufacturing the above light emitting device.
Figure 12:
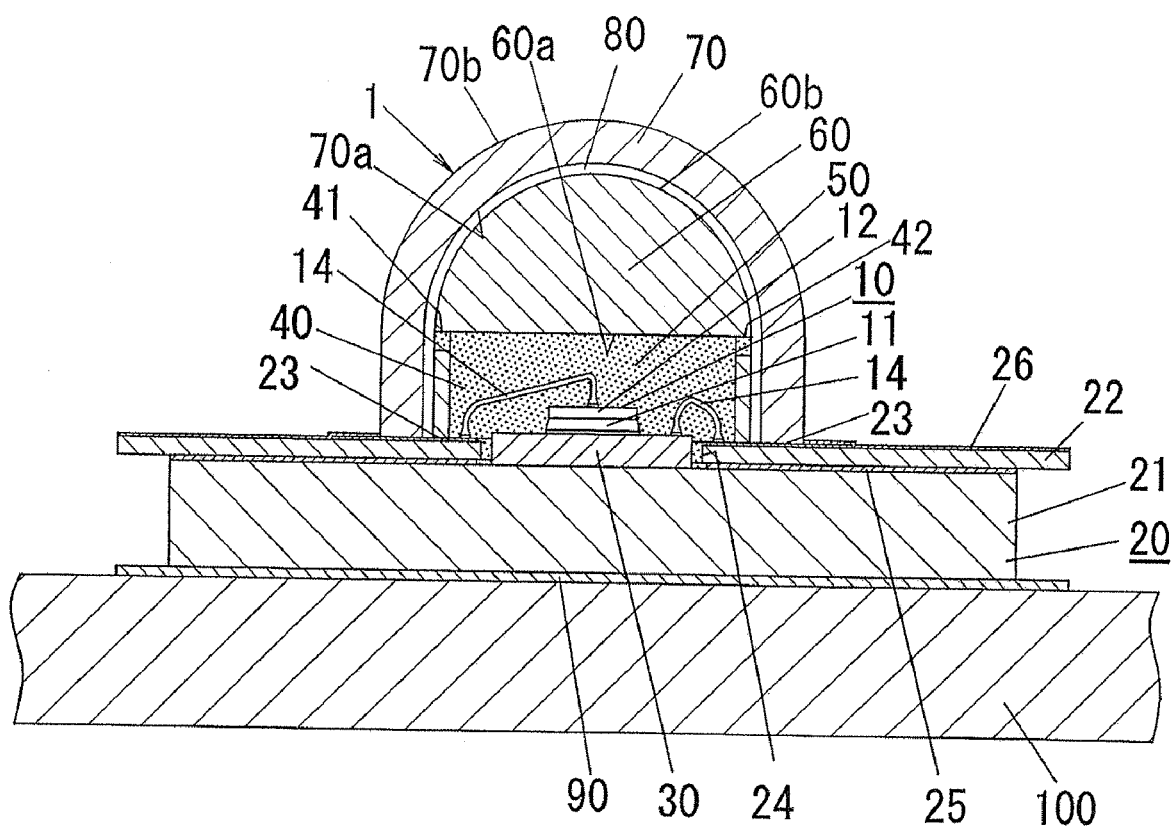
FIG. 12 is a cross sectional view of a light emitting device in accordance with a third embodiment.

The manufacturing method of the light emitting device 1 in this embodiment includes the following steps. Firstly, the LED chip 10 is mounted to the mounting substrate 20, and the LED chip 10 is connected to the mounting substrate 20 by means of the bonding wires 14, as shown in FIG. 11, and then the LED chip 10 and the bonding wires 14 are covered with the liquid (uncured) first encapsulation resin material (e.g. silicone resin) which becomes one part of the encapsulation member 50 (step (a)). Next, the liquid (uncured) second encapsulation resin material 50*b*, which is the same as the first encapsulation resin material 50*a* and becomes the other part of the encapsulation member 50, is filled within the recess 40 of the lens 60, and subsequently, the lens 60 is mounted on the mounting substrate 20 (step (b)). Then, the first encapsulation resin material 50*a* and the second encapsulation resin material 50*b* are cured to form the encapsulation member 50 (step (c)). Thereafter, the color conversion member 70 is secured to the mounting substrate 20 with the adhesive agent.

In this embodiment, resist layer 26 is configured to prevent an outflow of the first encapsulation resin material 50*a* to the connecting portion of the color conversion member 70, and ease thickness control of the adhesive agent (connecting portion) 75 between the color conversion member 70 and the mounting substrate 20, since the color conversion member 70 is attached to the edge of the mounting substrate 20 with the adhesive agent. With this arrangement, it leads to improving reliability. It is desirable that the adhesive agent (connecting portion) 75 is made of the same material as the color conversion member 70.

Third Embodiment

The light emitting device 1 of this embodiment shown in FIG. 10 is almost consistent in fundamental component with that of first embodiment. Like parts are designated by like reference numerals, and no duplicate explanation deemed necessary.

In this embodiment, the lens 60 is provided with an injection port 41 for injecting the encapsulating resin material into the recess 40, and a discharge port 42 for discharging a residue of said encapsulating resin material.

The manufacturing method of the light emitting device 1 in this embodiment includes the following steps. At first, LED chip 10 is mounted to the mounting substrate 20 and connected to mounting substrate 20 with bonding wires 14. Then, the lens 60 is adhered to the mounting substrate 20 to dispose the LED chip 10 and bonding wires 14 within the recess 40 of the lens (step (a)). Secondly, the recess 40 of the lens is filled with the uncured encapsulation resin material through the injection port 41 of the lens (step (b)). Next, the encapsulation resin material is cured to form the encapsulation member 50 (step (c)). Thereafter, the color conversion member 70 is adhered to the mounting substrate 20. With this method, the encapsulation member 50 can hardly suffer from generation of the voids in the manufacturing process.

Further, the manufacturing method of the light emitting device 1 is preferred to include the following steps. Firstly, the LED chip 10 is mounted to the mounting substrate 20, and the LED chip 10 is connected to the mounting substrate 20 by means of the bonding wires 14, and then the LED chip 10 and the bonding wires 14 are covered with the uncured first encapsulation resin material which becomes one part of the encapsulation member 50 (step (a)). Next, the lens 60 is adhered to the mounting substrate 20 so as to confine in the recess the LED chip 10 and the bonding wires 14 which are covered with the cured first encapsulation resin material (step (b)). Next, the uncured second encapsulation resin material 50*b*, which is the same as the first encapsulation resin material 50*a* and becomes the other part of the encapsulation member 50, is filled within the space confined between the color conversion member 70 and the mounting substrate 20 through the injection port 41 of the lens (step (c)). Thereafter, the first encapsulation resin material and the second encapsulation resin material are cured to form the encapsulation member 50 (step (d)). With this method, the encapsulation member 50 can hardly suffer from generation of the voids in the manufacturing process.

Although each of the above embodiments employs the blue-light LED chip with the blue luminescence as the LED chip 10 and the SiC substrate as the electrically conductive substrate 11, a GaN substrate may be used instead of the SiC substrate. The use of the SiC substrate and the GaN substrate as an epitaxial growth substrate enables to increase thermal conductivity and lower the heat resistance thereof, in comparison with the use of a sapphire substrate as a dielectric epitaxial growth substrate. Further, the luminescent color of the LED chip 10 is not limited to be blue, and may be red, green or the like. Namely, a material of light emission portion 12 of the LED chip 10 is not limited to a compound of GaN-based semiconductor material, and may be selected from a compound of GaAs-based, GaP-based semiconductor materials, or the like, depending on the luminescent color of the LED chip 10. Besides, the electrically conductive substrate 11 is not limited to SiC substrate, and may be optionally selected from GaAs substrate, GaP substrate, and the like, depending on the material of light emission portion 12. Furthermore, it should be noted that the sub-mount member 30 explained in each of the above embodiments is not necessarily provided in a circumstance where there is only the small difference of the linear expansion coefficient between the LED chip 10 and the mounting substrate 20. Moreover, the mounting substrate 20 may be configured differently from that explained in the each of the above embodiments.

As mentioned above, it is obvious that many widely different embodiments may be made in accordance with the technical concept of the present invention, and therefore the present invention should not be limited to the specific embodiments except as defined in the claims.

The invention claimed is:
1. A lighting device comprising:
an LED chip;
a mounting substrate configured to mount said LED chip thereto;
an encapsulation member made of an encapsulating resin material to encapsulate said LED chip;
a color-conversion member configured to contain a fluorescent material which is excited by a light emitted from said LED chip to emit a light of a color different from a luminescent color of said LED chip; and
a lens made of a transparent resin material;
where said lens is secured to said mounting substrate and is provided in its surface opposite to said mounting sub- strate with a recess for receiving therein said encapsulation member so that said lens surrounds said encapsulation member; and wherein said color-conversion member is disposed on said mounting substrate to cover said lens, and an air layer is formed between said color-conversion member and a light output surface of said lens.

2. A lighting device as set forth in claim 1, wherein said color-conversion member is dome-shaped.

3. A lighting device as set forth in claim 1, wherein said mounting substrate includes a heat conducting plate made of a heat conductive material, and a dielectric substrate which is superimposed on said heat conducting plate and is provided on its surface opposite of said heat conductive plate with a pair of lead patterns for electrical connection respectively with electrodes of said LED chip;

said dielectric substrate being formed with a through-opening at a location corresponding to said LED chip;

said LED chip being mounted within said through-opening to said heat conductive plate through a planar sub-mount member;

said sub-mount member being larger than said LED chip and configured to thermally couple said LED chip to said heat conductive plate while relieving a stress acting on said LED chip due to a difference of coefficient of linear expansion between said LED chip and said heat conductive plate.

4. A lighting device as set forth in claim 3, wherein said sub-mount member has a thickness such that one surface of said LED chip opposite to said sub-mount member is spaced further away from said heat conductive plate than from an end of said color-conversion member opposite to said mounting substrate.

5. A lighting device as set forth in claim 1, wherein said lens is provided with an injection port for injecting said encapsulating resin material into said recess, and a discharge port for discharging a residue of said encapsulating resin material.

6. A method of fabricating the lighting device as defined in claim 1, said method comprising the steps of:
   (a) mounting said LED chip to said mounting substrate and subsequently covering said LED chip with an uncured first encapsulating resin material forming a portion of said encapsulation member;
   (b) injecting an uncured second encapsulating resin material into said recess of the lens, and disposing said lens on said mounting substrate in such a manner that said lens covered by said first encapsulating resin material is received in said recess, said second encapsulating resin material being made of the same material as said first encapsulating resin material to form the remainder of said encapsulation member;
   (c) curing said individual encapsulating resin materials to form said encapsulation member; and
   (d) disposing a color-conversion member on said mounting substrate to cover said lens, and forming an air layer between said color-conversion member and a light output surface of said lens, wherein the color-conversion member is configured to contain a fluorescent material which is excited by a light emitted from said LED chip to emit a light of a color different from a luminescent color of said LED chip.

7. A method of fabricating the lighting device as defined in claim 5, said method comprising the steps of:
   (a) mounting said LED chip to said mounting substrate and subsequently securing said lens to said mounting substrate to dispose said LED chip within said recess;
   (b) injecting an uncured encapsulating resin material through said injection port of said lens into the recess of said lens;
   (c) curing said encapsulating resin material to form said encapsulation member; and
   (d) disposing a color-conversion member on said mounting substrate to cover said lens, and forming an air layer between said color-conversion member and a light output surface of said lens, wherein the color-conversion member is configured to contain a fluorescent material which is excited by a light emitted from said LED chip to emit a light of a color different from a luminescent color of said LED chip.

8. A method of fabricating the lighting device as defined in claim 5, said method comprising the steps of:
   (a) mounting said chip to said mounting substrate and subsequently covering said LED chip with an uncured first encapsulating resin material forming a portion of said encapsulation member;
   (b) securing said lens to said mounting substrate in such a manner that the LED chip covered by said first encapsulating resin material is disposed within said recess;
   (c) injecting an uncured second encapsulating resin material into said recess of the lens through the injection port of said lens, said second encapsulating resin material being made of the same material as said first encapsulating resin material to form the remainder of said encapsulation member;
   (d) curing said individual encapsulating resin materials to form said encapsulation member; and
   (e) disposing a color-conversion member on said mounting substrate to cover said lens, and forming an air layer between said color-conversion member and a light output surface of said lens, wherein the color-conversion member is configured to contain a fluorescent material which is excited by a light emitted from said LED chip to emit a light of a color different from a luminescent color of said LED chip.

9. A lighting device as set forth in claim 1, wherein said lens is shaped into a convex such that the light incident on a light input surface of said lens facing said encapsulation member sees no total internal reflection at an interface between said light output surface and said air layer.

* * * * *